(12) United States Patent
Kenington (10) Patent No.: US 7,706,467 B2
(45) Date of Patent: Apr. 27, 2010

(54) TRANSMITTER WITH AN ENVELOPE TRACKING POWER AMPLIFIER UTILIZING DIGITAL PREDISTORTION OF THE SIGNAL ENVELOPE

(75) Inventor: Peter Blakeborough Kenington, Chepstow (GB)

(73) Assignee: Andrew LLC, Hickory, NC (US)

( * ) Notice: Subject to any disclaimer, the term of this patent is extended or adjusted under 35 U.S.C. 154(b) by 1114 days.

(21) Appl. No.: 11/016,508

(22) Filed: Dec. 17, 2004

(65) Prior Publication Data
US 2006/0209984 A1    Sep. 21, 2006

(51) Int. Cl.
    *H04L 25/03* (2006.01)
(52) U.S. Cl. .................. 375/296; 375/297
(58) Field of Classification Search .......... 375/285, 375/296, 297
    See application file for complete search history.

(56) References Cited

U.S. PATENT DOCUMENTS

| | | | |
|---|---|---|---|
| 4,972,440 A * | 11/1990 | Ernst et al. | 375/296 |
| 5,251,330 A | 10/1993 | Chiba et al. | |
| 5,420,536 A | 5/1995 | Faulkner et al. | |
| 6,043,707 A | 3/2000 | Budnik | |
| 6,141,541 A * | 10/2000 | Midya et al. | 455/91 |
| 6,157,253 A | 12/2000 | Sigmon et al. | |
| 6,160,449 A | 12/2000 | Klomsdorf et al. | |
| 6,240,278 B1 * | 5/2001 | Midya et al. | 330/149 |
| 6,407,634 B1 | 6/2002 | Staudinger et al. | |
| 6,600,369 B2 | 7/2003 | Mitzlaff | |
| 6,646,501 B1 | 11/2003 | Wessel | |
| 6,774,719 B1 | 8/2004 | Wessel et al. | |
| 6,794,931 B2 | 9/2004 | Kenington | |
| 6,853,246 B2 * | 2/2005 | Bauder et al. | 330/149 |
| 7,023,273 B2 | 4/2006 | Johnson et al. | |
| 7,043,213 B2 * | 5/2006 | Robinson et al. | 455/127.2 |
| 7,058,369 B1 | 6/2006 | Wright et al. | |
| 7,062,236 B2 | 6/2006 | Midtgaard et al. | |
| 7,183,847 B2 * | 2/2007 | Suzuki et al. | 330/149 |
| 7,200,367 B1 | 4/2007 | Wright et al. | |
| 7,339,426 B2 * | 3/2008 | Gurvich et al. | 330/136 |
| 2002/0145470 A1 | 10/2002 | Staudinger et al. | |
| 2003/0117215 A1 | 6/2003 | O'Flaherty et al. | |
| 2004/0061555 A1 | 4/2004 | Lynch | |

FOREIGN PATENT DOCUMENTS

| | | |
|---|---|---|
| EP | 0360178 A2 | 3/1990 |
| EP | 0382695 A2 | 8/1990 |
| EP | 0431201 A1 | 12/1991 |
| EP | 0717504 A2 | 6/1996 |
| GB | 2345212 A | 6/2000 |
| WO | WO02/058249 | 7/2002 |
| WO | WO02/093858 | 11/2002 |
| WO | WO03/056698 | 7/2003 |
| WO | WO2004/075398 | 9/2004 |

* cited by examiner

*Primary Examiner*—David B Lugo
(74) *Attorney, Agent, or Firm*—Wood, Herron & Evans LLP (57) ABSTRACT

A transmitter comprises an amplifier operable for receiving an input signal and amplifying the input signal to produce an output signal. A power supply is coupled to the amplifier for supplying power to the amplifier, the power supply operable for tracking the input signal and varying the level of power supplied to the amplifier in response to variation of the input signal. A predistortion circuit is coupled to the power supply, the predistortion circuit operable for receiving the input signal and predistorting the input signal to the power supply for addressing input signal tracking capabilities of the power supply.

22 Claims, 7 Drawing Sheets

TRANSMITTER WITH AN ENVELOPE TRACKING POWER AMPLIFIER UTILIZING DIGITAL PREDISTORTION OF THE SIGNAL ENVELOPE

BACKGROUND OF THE INVENTION

In wireless communication applications, such as cellular phone services or other wireless services, amplifiers are used to provide the desired signal coverage for the particular wireless application. For example, radio frequency (RF) power amplifiers are used for boosting the level of an RF signal prior to transmission of that signal. RF power amplification techniques, and particularly RF power amplification techniques used for wireless applications, have inherent drawbacks to which the industry continues to direct its efforts. Specifically, in developing an RF transmission system, considerable attention is given to amplifier efficiency and signal distortion of the amplified signal.

Amplifier efficiency, which is generally defined as the level of RF power that may be achieved at the output signal compared to the power that is input into the overall amplification process, is conventionally somewhat low in wireless applications. Therefore, considerable attention within the power amplifier industry has been devoted to methods of enhancing power amplifier efficiency. Small increases in amplifier efficiency can provide significant benefits in a wireless system and reduce the overall costs necessary to run the system.

Another drawback in RF power amplification, which must be addressed and taken into account with any methods for improving efficiency, is signal distortion. An RF power amplifier, to a greater or lesser extent, exerts a distorting effect on the RF signals that are amplified. Non-linearities of the amplifier, as well as other factors, contribute to the distortion. Such distortion must be controlled to ensure that the RF transmitter meets the various standards regarding RF interference.

To address amplifier efficiency, one current technique involves the use of envelope tracking of the input signal to the amplifier and use of the detected envelope to vary the amplifier operation. In an envelope tracking system, a variable power supply is utilized for supplying power to the amplifier. The envelope power levels of the input signal are monitored, and the power that is supplied to the power amplifier, or typically to the final stage(s) of the power amplifier, is varied based on the monitored envelope levels. More specifically, the power that is supplied to the amplifier is varied so as to be just sufficient to reproduce the power level required by the amplifier at a given instant of time. Therefore, at low envelope power levels, a low supply voltage is provided to the amplifier, and the full supply voltage is only provided when the maximum envelope power is required, that is, at the envelope peaks.

However, while envelope-tracking techniques improve efficiency, various current implementations of those envelope tracking techniques have various drawbacks. Such drawbacks are associated with the ability of the system to respond to the signal envelope. More specifically, in current envelope-tracking implementations, the detected input signal envelope is fed directly to the tracking input of the power supply. However, since there are imperfections or non-linearities in the tracking behavior of the power supply, the resulting output voltage from the power supply is only a crude approximation of the envelope levels actually required for the power amplifier. If, for a particular envelope peak, the power supply output is not sufficient for the amplifier requirements, the distortion produced by the amplifier could be greatly increased, even after predistortion of the input signal has been taken into account to address other inherent non-linearities in the power amplifier.

Therefore, it is desirable to improve upon the efficiency and linearity of an RF power amplifier, in a transmitter system. It is particularly desirable to improve upon the efficiency of a power amplifier by means of an envelope tracking power supply.

BRIEF DESCRIPTION OF THE DRAWINGS

The accompanying drawings, which are incorporated in and constitute a part of this specification, illustrate embodiments of the invention and, together with a general description of the invention given below, serve to explain the principles of the invention.

DETAILED DESCRIPTION

The present invention addresses the above-noted drawbacks in the prior art, and specifically addresses the non-linearities and other characteristics of a power supply utilizing envelope tracking in a power amplifier system. Specifically, the present invention addresses imperfections in the tracking behavior of the power supply by predistorting the envelope signal provided to the tracking power supply to ensure that it accurately reflects the true status of the input signal envelope at a given instant in time. For example, the predistortion of the envelope signal in an envelope-tracking power amplifier is utilized to address various non-linearities and slew-rate limitations in the tracking power supply that feeds the drain or drains of the main RF amplifier devices.

In another aspect of the invention, the predistortion provides over-compensation of the envelope characteristics to deliberately create a small amount of "head room" in the power that is supplied to the amplifier circuit to thus ensure that the drain or drains of the power amplifier have sufficient voltage to reproduce the desired amplified RF wave form at any given point in time.

In another embodiment, the predistortion is adapted such that the envelope-tracking predistortion can be modified to ensure that it achieves and maintains the required performance of the power amplifier to address factors such as component aging, power level changes, and temperature changes in the various components and systems utilized in the power amplifier.

Figure 1:
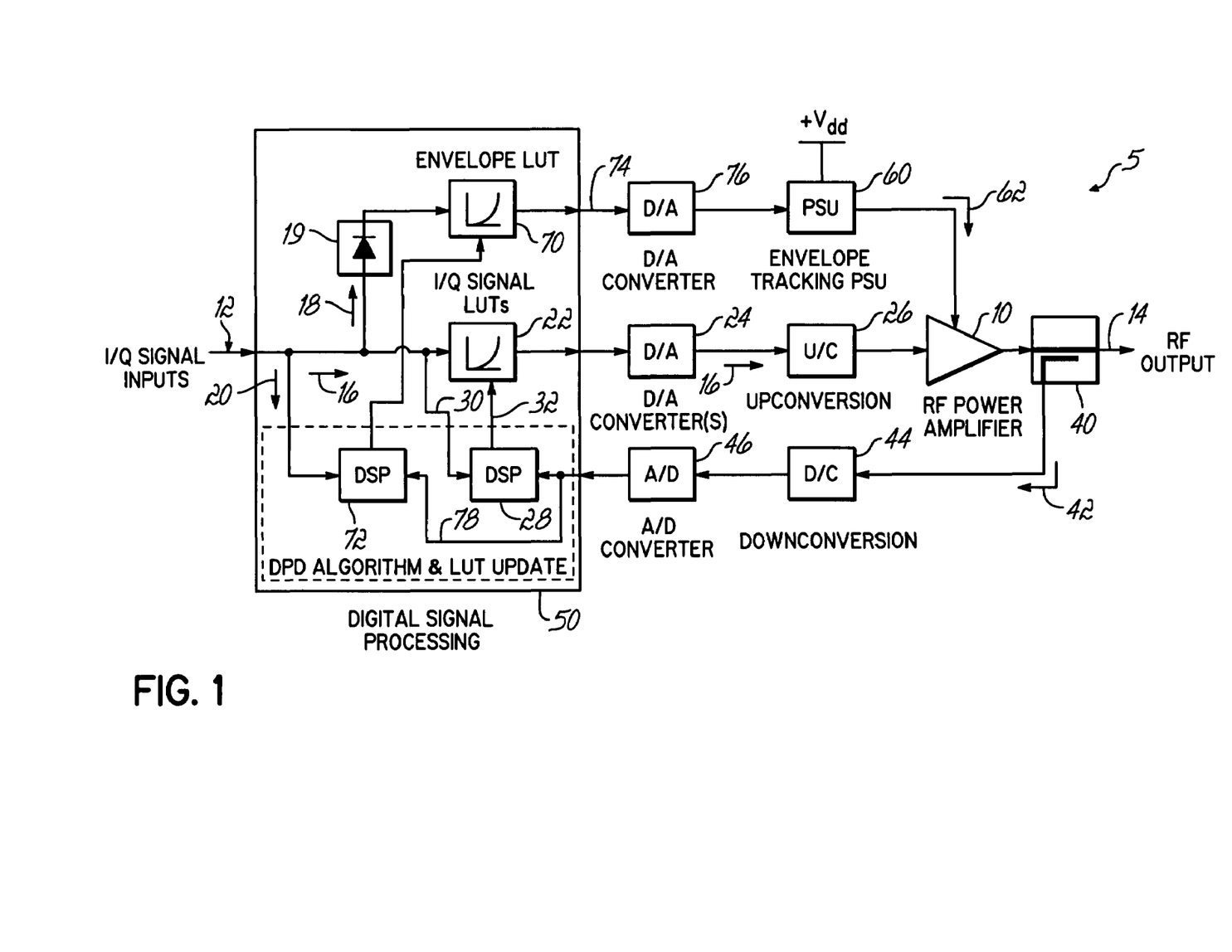
FIG. 1 illustrates an embodiment of the present invention utilizing predistortion of an envelope signal in an envelope-tracking power amplifier.

FIG. 1 illustrates one embodiment of the present invention utilized to improve the performance, and specifically improve the efficiency, of a power amplifier. For example, referring to FIG. 1, the overall transmission system, or transmitter 5, includes an amplification device or amplifier 10, such as an RF power amplifier that receives an input signal 12, and produces RF output 14. The power amplifier 10 may be a single stage or multiple stage amplifier of a suitable variety for RF power amplification. In the transmitter circuit illustrated in FIG. 1, generally the input signal 12 will take various paths through the transmitter 5 to achieve the desired performance enhancement of transmitter 5. Mainly, the input signal 12 proceeds along a main signal path (MSP) 16 to be amplified by amplifier 10. The input signal 12 is also coupled to an envelope-tracking path 18 and is coupled to a signal processing path 20. Along the main signal path (MSP) 16, input signal 12 proceeds to the input of amplifier 10, where it is amplified and produced as an output 14. Along the way, it may be further processed for improving the operation of the RF power amplifier. For example, as shown in FIG. 1, a signal in the MSP may be predistorted, either digitally or in an analog fashion, to address non-linearities in the power amplifier 10, according to well known principles. Of course, other linearization techniques might also be utilized along the MSP to address non-linearities in the amplifier 10. For the purposes of illustrating the present invention, the predistortion of the input signal along the MSP 16 is disclosed in the Figures as digital predistortion and various digital predistortion techniques are illustrated in FIGS. 1-6 for MSP 16. However, it would be understood by a person of ordinary skill in the art, that various other linearization techniques, digital or analog, might be utilized along the MSP 16 for addressing amplifier non-linearities and distortion and for enhancing the performance of power amplifier 10. The present invention is thus not limited to the linearity techniques or predistortion techniques of the MSP that are illustrated.

Referring again to FIG. 1, the input signals 12 are shown in a digital form as quadrature I/Q signals, which, along the main path 16, are directed to predistortion circuit 22, such as a digital predistortion lookup table circuit (LUT). The predistortion circuit 22 predistorts the input signal 12 in conventional fashion, whereupon the predistorted input signal is converted to analog by a D/A converter 24, upconverted from baseband to RF by upconversion circuitry 26, and then amplified by the RF power amplifier 10 to produce analog RF output signal 14. A digital predistortion circuit 22, which may be a lookup table (LUT) circuit, as illustrated in FIG. 1, will generally include additional digital signal processing (DSP) circuitry 28, which will include sufficient signal processing circuitry for implementing the digital predistortion algorithm, and any adaptation of the predistortion circuit. For example, the LUTs of circuit 22 may need to be adaptively populated and updated, which may be handled by the DSP 28. Furthermore, any correction or updates to the LUT predistortion is handled by the DSP 28.

Generally, according to known LUT predistortion principles, the I/Q input signals 12 are directed via path 30 to the DSP 28 and are utilized to drive the predistortion generation process. Specifically, the DSP 28 via path 32 utilizes the values of the I/Q input signals to index and look up corresponding predistortion I/Q values in the respective LUTs. The LUT output coefficients are indexed by the magnitude of the input signals 12. The coefficients are used, via complex multiplication, to distort the input I/Q signals. DSP 28 can also be utilized to adaptively update the values of the LUTs in predistortion circuit 22, or to provide additional correction algorithms through the predistortion circuit 22 according to known digital predistortion techniques.

Referring to FIG. 1, a coupler 40 might be utilized to couple the analog output 14 to DSP 28 through path 42 and through appropriate down conversion circuitry 44 and A/D converter circuitry 46. DSP 28 utilizes the coupled output signal on path 42 to adapt the LUTs of circuit 22 based upon the knowledge of the performance of the predistortion provided by output 42. Generally, digital predistortion circuits 22 and the supporting DSP 28 will all be incorporated together within a larger overall DSP circuit indicated by reference numeral 50 in FIG. 1. However, separate blocks or circuits might also be utilized. Accordingly, the present invention is not limited to specific layouts or positions of the DSP blocks, which handle the predistortion and/or the adaptation of the predistortion.

In the present invention, an envelope-tracking power supply 60 is utilized and is coupled to power amplifier 10 for supplying power to the amplifier via path 62. As noted above, in an envelope-tracking power supply, the power supply 60 is operable for tracking the input signal envelope, derived from input signals 18 and varying the level of power supplied to the amplifier in response to variation of the input signal envelope. More specifically, in standard envelope-tracking power supplies, the power supplied to amplifier 10 via power supply 60 is varied so as to be sufficient to reproduce, at the amplifier output 14, the power level required at a given instant. Therefore, at low envelope power levels, a low supply voltage is provided to amplifier 10. A full supply voltage is only provided when maximum envelope power is required, such as at the envelope peaks of the input signal.

As noted above, in current implementations of such an envelope-tracking technique, the input signal envelope is fed directly to the tracking input of the envelope-tracking power supply 60. However, due to non-linearities in the transfer characteristics of the power supply, the output power from the supply and, more specifically, the output voltage, is not a precise approximation of the power levels that are required for a particular input signal envelope. The present invention addresses the deficiencies in the input signal tracking capabilities of the power supply and, specifically, the non-linearities in the transfer characteristics of the power supply, by predistorting the envelope signal 18 provided to the envelope-tracking power supply 60 to ensure that the output of the power supply 60 accurately reflects the status of the envelope at any given instant in time for proper power supply efficiency and little or no distortion of the amplified signal.

To that end, the digital signal processing circuit 50 of the transmitter 5 of the invention incorporates a predistortion circuit 70 for predistorting the envelope signals 18. The predistortion circuit, for example, may be a digital predistortion circuit, such as an LUT circuit of FIG. 1 or a polynomial-based predistorter (see FIG. 3). While a digital predistortion circuit 70 for the envelope is primarily discussed herein, an analog predistortion circuit, such as that shown in FIG. 7, might also be utilized for predistorting the input signal envelope.

The input signal 12 may be coupled from the MSP 16 onto path 18 where it is directed to predistorter circuit 70. Because the input signal envelope is utilized for the purposes of an envelope-tracking power supply, the digital signal processing circuitry 50 would generally utilize an envelope detector 19, which may be part of the digital signal processing circuitry 50 either as a part of the envelope predistortion circuit 70 or separate therefrom. The concept of envelope detection, which essentially extracts the magnitude information of the input signal, is known to a person of ordinary skill in the art. For example, one type of envelope detector is noted by:

$$env = \sqrt{I^2 + Q^2}$$

Utilizing the detected envelope, the predistortion circuit 70 predistorts the input signal envelope before it is directed to power supply 60. Circuit 70, and supporting DSP 72 are configured so that the predistortion of the input signal envelope on path 18 is sufficient to address the input signal tracking capabilities of the power supply, and specifically to address non-linearities associated with the power supply and its envelope-tracking capabilities. The power supply 60 then uses the predistorted envelope signal 74 to meet the power requirements of power amplifier 10, despite non-linearities in the power supply 60.

The predistortion circuit 70 may provide any number of various suitable predistortion techniques to predistort the envelope signals 18 including, for example, an envelope LUT, as shown in FIG. 1. Similar to LUTs utilized for signal predistortion on the MSP, predistortion circuit 70 may be supported by DSP 72, utilized to execute the predistortion algorithm for the envelope and also to populate and/or update the LUTs of circuit 70 and to provide overall adaptation of the predistortion circuit 70 and its operation based upon the achieved output of power amplifier 10. To that end, the input signals 12 on path 20 are utilized by DSP 72 to implement the predistortion algorithm, such as to index and select LUT values in the example of an LUT predistorter. Similarly, the amplifier output 14 that is fed back on path 42 is also utilized by DSP 72 for updating, correcting, and adapting predistorter circuit 70. As with other predistortion circuits and DSP circuits, the various components set forth herein may be incorporated into an overall larger digital signal processing circuit block 50, or may be implemented as stand-alone components or circuits.

DSP circuit 72, which operates in conjunction with the predistortion circuit 70, may also implement an envelope detector (not shown) in the respective input line 20 for the purpose of utilizing the detected envelope to drive the predistortion generation process.

For the envelope predistortion, the detected envelope associated with line 18 is utilized to drive the predistortion process of circuit 70. If an LUT predistortion is utilized, a stream of digital samples of the envelope is fed to DSP 72, which results in the indexing and selection of a corresponding stream of samples forming I and Q channel correction signals, respectively, according to known LUT techniques. Those correction signals are then applied to correct the envelope signals, such as through a vector modulator, for example. The corrected envelope signal on line 74 is then converted by a D/A converter 76 to an appropriate analog signal for utilization by the envelope-tracking power supply 60. Specifically, the predistorted envelope signal feeds the envelope modulation input of the envelope-tracking power supply 60 to thus ensure that the output voltage on line 62 provides adequate tracking of the input signal envelope on line 18. The predistortion circuit 70 is configured and operable for predistorting the input signal envelope to address the input signal tracking capabilities of the power supply. The predistortion addresses the operational parameters of power supply 60, such as the non-linearities in the transfer function of the power supply and address other imperfections in the tracking behavior of power supply 60, such as slew rate limitations, for example.

The predistortion circuit 70 may be configured to provide any desired predistortion of envelope signal 18 in order to offset the effects of the power supply 60. In one aspect of the invention, the predistortion will be a variation from ordinary MSP predistortion. For example, in MSP predistortion, even order components are usually set to zero to correct the inter-modulation distortion (IMD) created by the odd order components in the amplifier transfer characteristic. For the envelope predistorter, however, even order components are also utilized and considered. For example, using a LUT predistorter as shown in FIG. 1 for the envelope predistortion, both odd and even order components are generated. The same holds true if polynomial predistortion of the envelope is used, as discussed below.

In accordance with another aspect of the present invention, the predistortion circuitry 70 is operable for predistorting the input signal envelope to cause over-compensation in the level of power that is supplied to the amplifier 10 to ensure proper efficient and linear amplification. That is, the predistortion algorithm provided through DSP 72 and predistortion circuit 70 might be configured to create a small margin above the required minimum envelope level at any given instant in time to ensure that the envelope-tracking process provides sufficient power to amplifier 10 so as not to degrade the inter-modulation distortion (IMD) performance of the amplifier. In that way, the amplifier 10 is able to handle significant envelope peaks. The present invention thus operates on the realization that the power supply output 62 does not need to precisely follow the input envelope in order to achieve the desired results of the invention. Rather, the output of supply 60 merely needs to "at least" follow the envelope or be slightly above the envelope. While the built-in over-compensation provided by the predistortion circuit 70 may result in a very small and almost negligible loss in efficiency of the overall transmitter 5, it will ensure that adequate IMD performance is guaranteed without significantly adding to the overall system complexity. The IMD performance of the transmitter 5 is also addressed by the conventional predistortion circuitry in the MSP 16, separate and apart from the envelope predistortion provided by the invention.

In an alternative embodiment of the invention, the over-compensation provided by the predistortion circuit 70 might be related to the level of the input signal envelope. In such a case, the predistortion might be tailored according to the envelope level. For example, for low envelope levels, the predistortion circuit 70 might be operable to predistort the envelope so that the predistorted envelope 74 closely tracks the input signal envelope 18. However, for high envelope levels, the predistortion of the envelope by circuit 70 provides overcompensation in the envelope so the amplifier can address the higher input signal levels. In still another alternative, the predistorter circuit might be configured to only predistort the envelope at higher levels above a certain threshold level.

Figure 2:
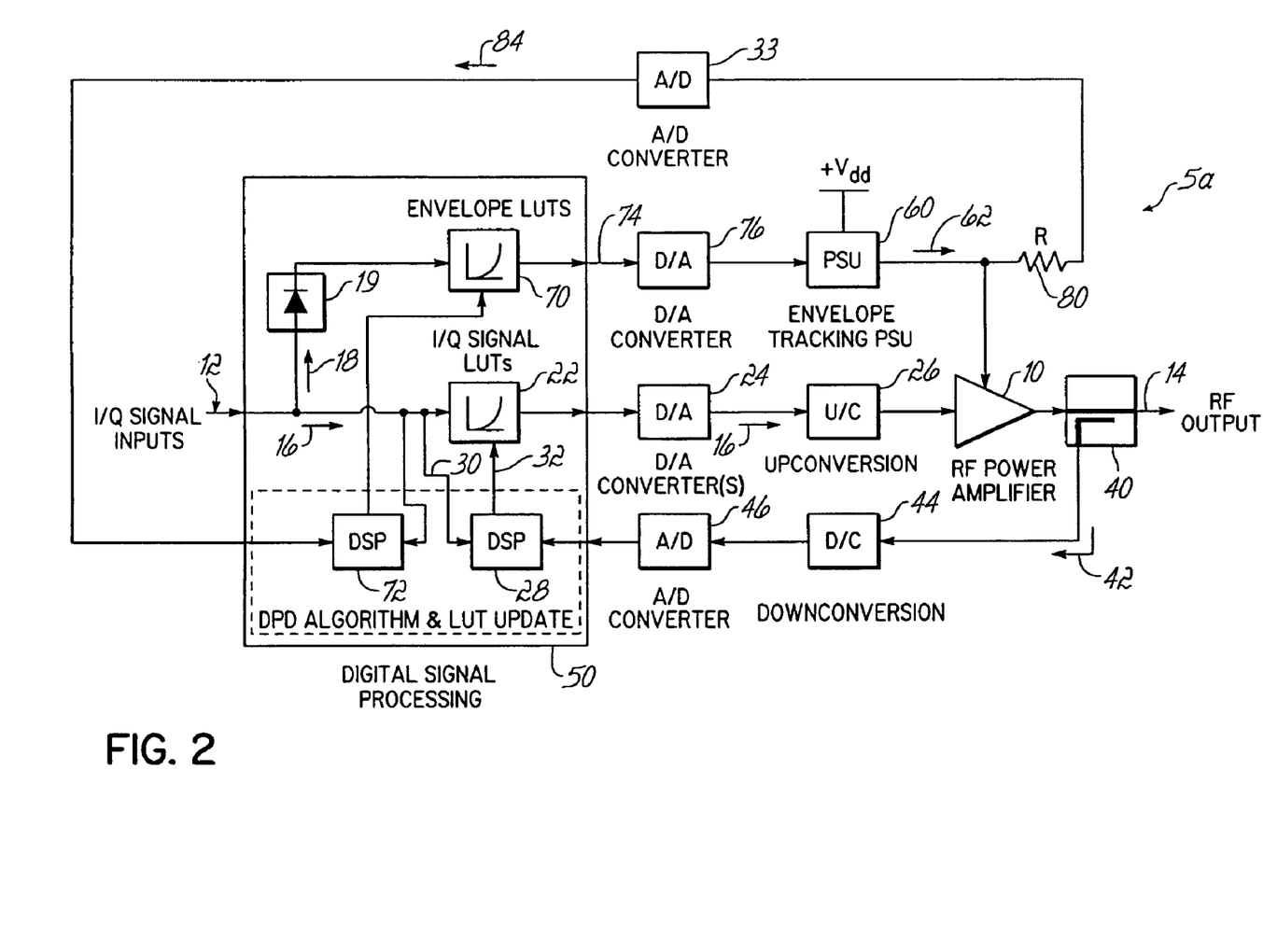
FIG. 2 illustrates an alternative embodiment of the circuit of FIG. 1 utilizing an alternative feedback signal.

The adaptation of predistortion circuit 70, which operates on the input signal envelope, as illustrated in FIG. 1, makes use of output feedback via path 42 coupled from the power amplifier output 14. As illustrated by path 78, the coupled output is utilized by DSP 72 to populate and adapt the LUTs of the predistortion circuit 70 and to provide any necessary correction to the predistortion algorithm. FIG. 2 illustrates an alternative embodiment in which a separate feedback path is utilized to provide linearization information for adapting the predistortion; such as by adapting the envelope LUTs of predistortion circuit 70. Specifically, the predistortion circuit 70 and DSP 72 of transmitter 5a utilize a feedback signal directly from the output of line 62 from the envelope-tracking power supply 60. That is, the DSP was the tracking output signal 62 of the power supply. That signal is directed through an appropriate impedance element 80 and analog/digital (A/D) converter 33 to provide digital feedback to DSP 72 for utilization for adapting and optimizing the predistortion circuit 70. The feedback loop is illustrated by path 84.

Figure 3:
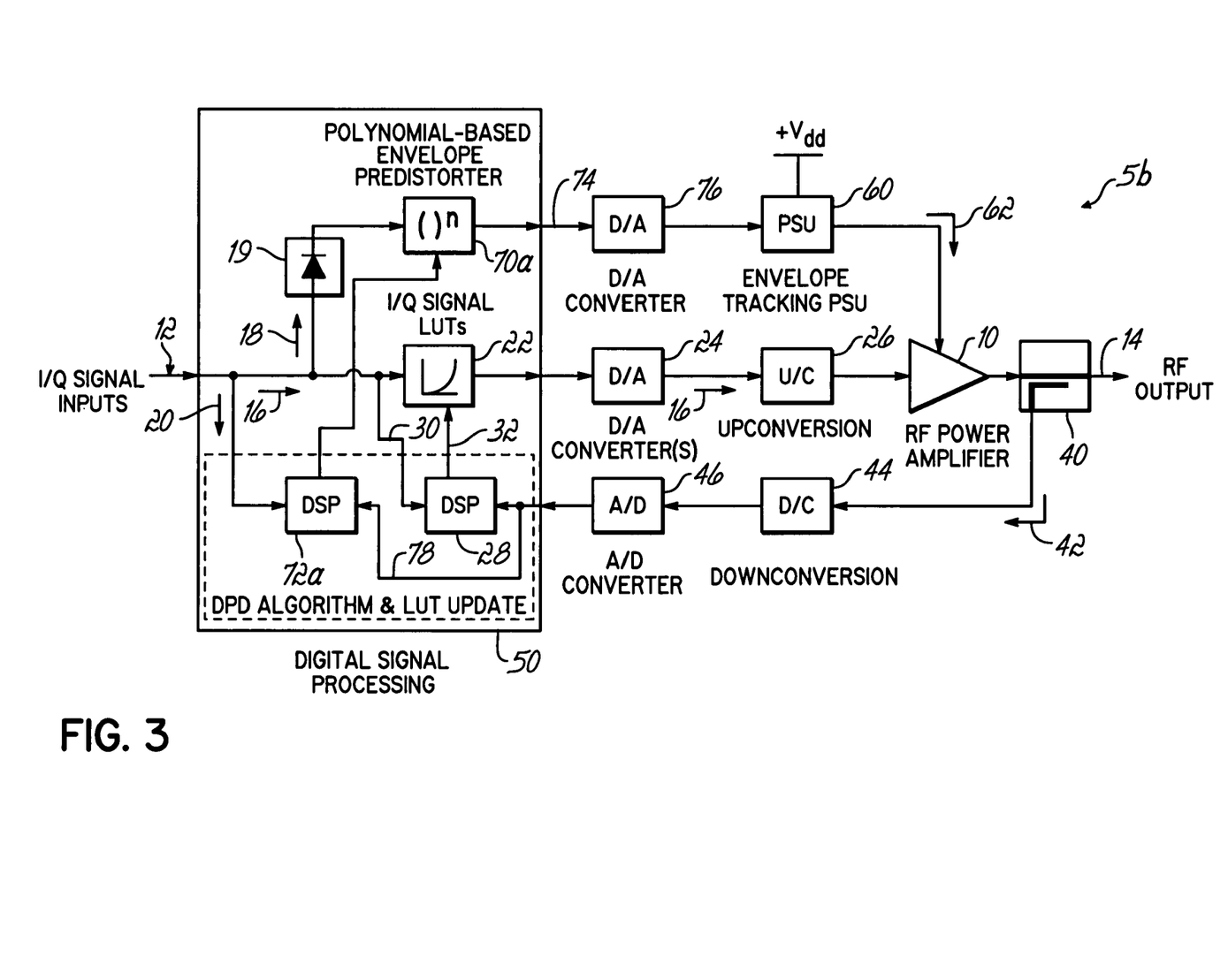
FIG. 3 illustrates an alternative embodiment of the present invention utilizing polynomial-based envelope predistortion.

As noted above, the predistortion of the envelope provided by the present invention is not limited to digital predistortion techniques generally or the LUT-based predistortion shown in FIGS. 1 and 2. An additional alternative embodiment of the invention is illustrated in FIG. 3. The DSP block 50, and specifically predistortion circuit 70a of transmitter 5b utilizes a polynomial-based algorithm, such as a polynomial approximation of the form:

$$y=ax+bx^2+cx^3+dx^4+ex^5+\ldots \quad \text{EQUATION 1}$$

where a, b, c, d, e, etc. are constants (and may be negative).

Figure 5:
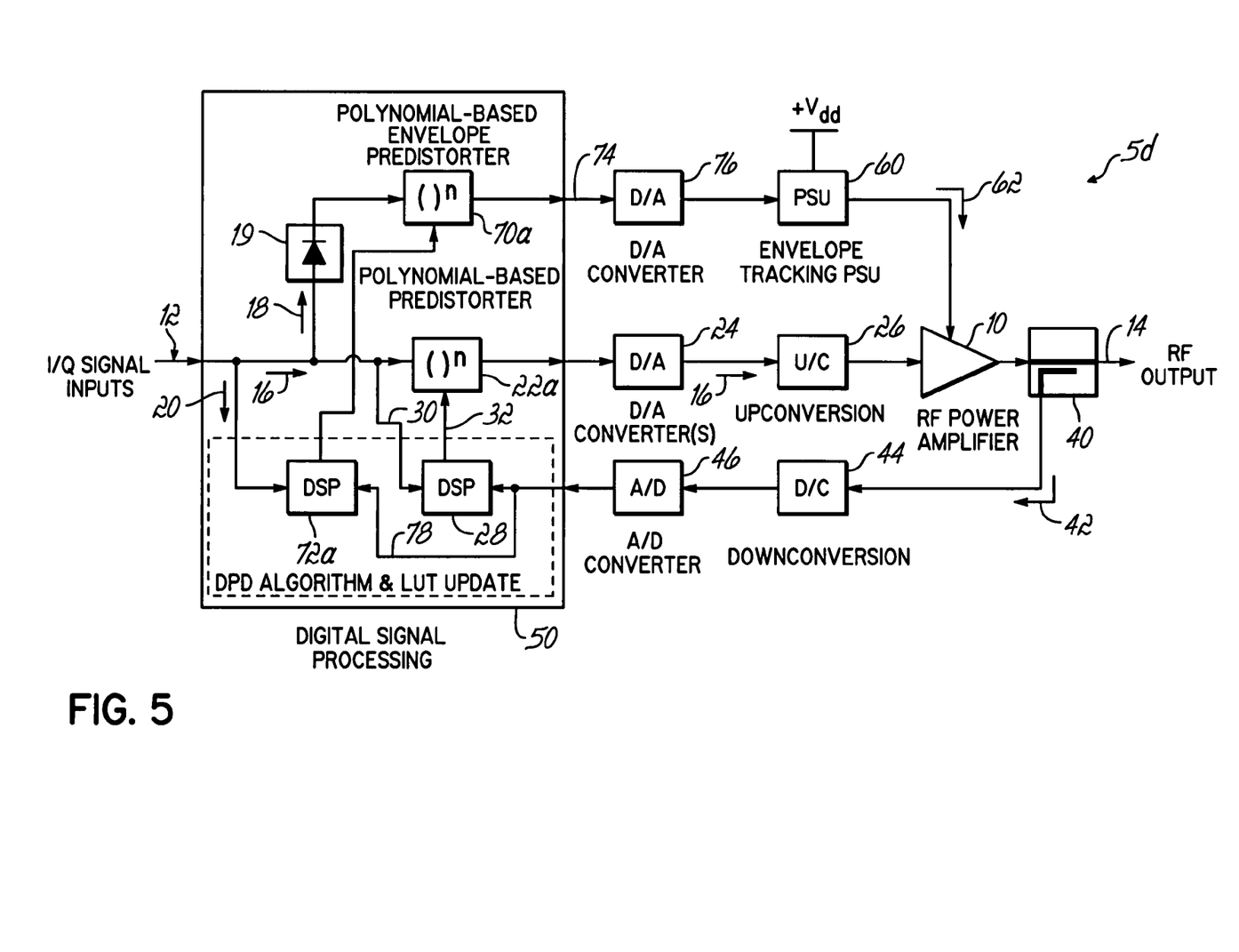
FIG. 5 is an alternative embodiment of the invention utilizing polynomial-based predistortion for the main signal path and the envelope.
Figure 6:
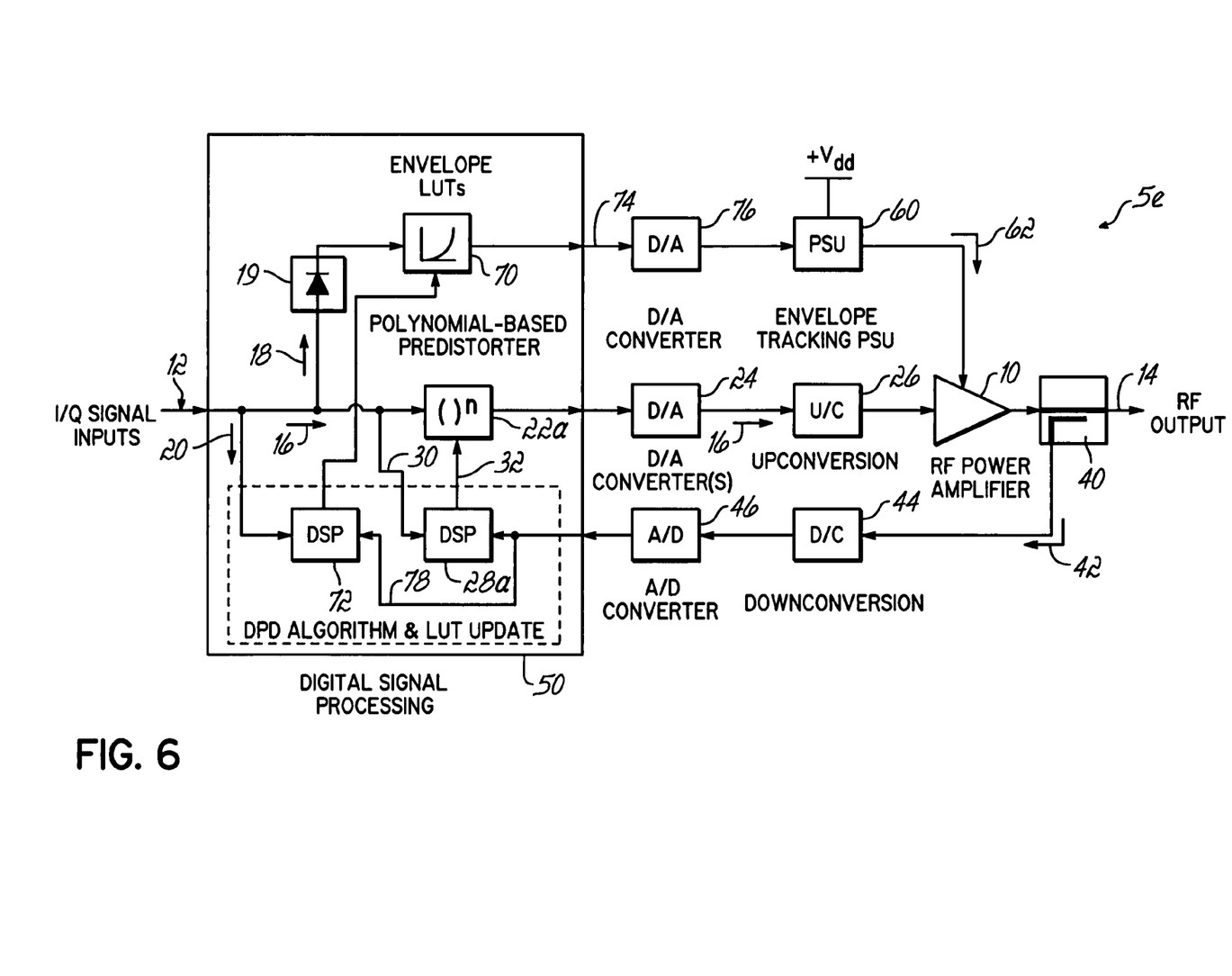
FIG. 6 is an alternative embodiment of the invention utilizing different predistortion techniques for the main signal path and envelope path.

The polynomial approximation is a known digital predistortion technique and replaces a "piecewise" approximation utilized by a LUT approach, as illustrated in FIGS. 1 and 2. A significant advantage of a polynomial expansion and approximation lies in its straightforward simplicity. This results in a significant reduction in the memory storage requirements for predistorter circuit 70a and/or DSP 72a. For example, only the coefficients a, b, c, etc. from EQ1 above need to be stored and updated, instead of hundreds, or possibly thousands, of points that are required in an LUT predistortion scenario. A polynomial-based predistortion is also often utilized in the MSP for predistorting the main signal, as illustrated in FIGS. 5 and 6.

Such polynomial-based predistortion techniques are known. However, in accordance with one aspect of the present invention, the polynomial-based envelope predistortion circuit 70a is a variation from ordinary MSP predistortion as noted above. Specifically, when polynomial predistortion is utilized in the MSP, the even order coefficients are usually set to zero because only intermodulation distortion (IMD) is being corrected. Such intermodulation distortion is created by odd order components in the amplifier transfer characteristic. However, for envelope predistortion, both odd and even ordered components are likely to be required, because it is a baseband envelope signal on line 18 that is being distorted or corrected. Therefore, the polynomial approximation for the envelope circuit 70a takes the even ordered components into account when utilizing polynomial predistortion, the predistortion circuits 72a, 70a provide a predistorted envelope to power supply 60.

Figure 4:
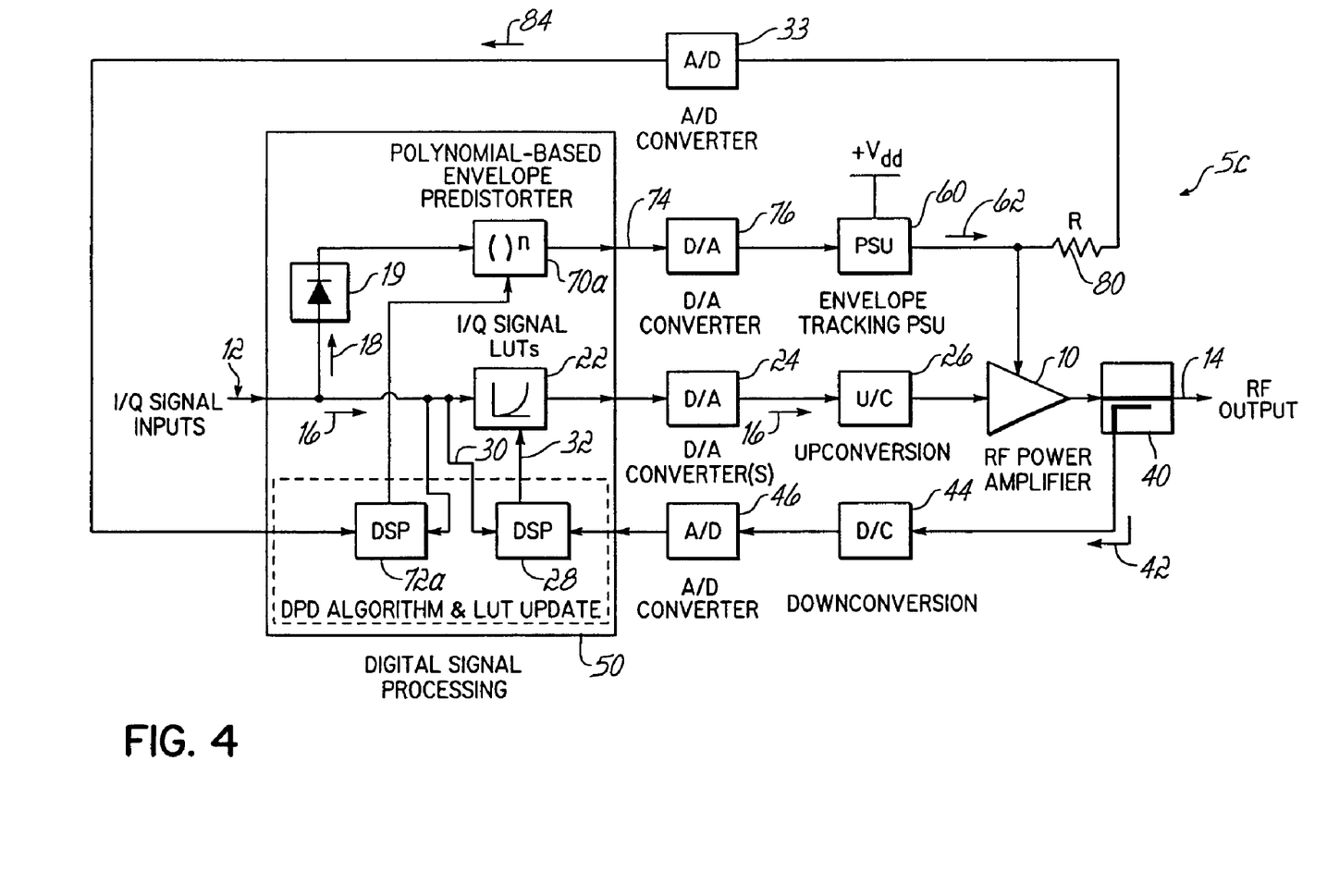
FIG. 4 is an alternative embodiment of the circuit in FIG. 3 utilizing alternative feedback (AF).

FIG. 3 utilizes an adaptive feedback for DSP 72a on path 42, which couples off a portion of the RF output 14. FIG. 4 illustrates an alternative embodiment wherein, like FIG. 2, the adaptive feedback for DSP 72a of the transmitter 5c is pulled directly from the output of the envelope-tracking power supply on path 62.

As noted above, polynomial-based predistortion, like other predistorter techniques, could be utilized in the MSP 16 or the envelope-tracking 18, or in both. Similarly, as shown in FIG. 1, LUT predistortion might be utilized in either of the MSP or the envelope-tracking path, or in both. For example, FIG. 5 illustrates an amplifier circuit 5d with a polynomial-based predistortion circuit 22a in the MSP and a polynomial-based envelope predistortion circuit 70a in the envelope-tracking path according to the invention. Alternatively, FIG. 6 illustrates a transmitter 5e, which utilizes a LUT-based predistortion for the envelope path 18 similar to FIG. 1, while utilizing a polynomial-based predistortion in the MSP 16 similar to FIG. 5. While FIGS. 5 and 6 both illustrate the coupled RF output 14 as the feedback to the DSPs 72, 72a, 28a, a similar feedback loop as illustrated in FIGS. 2 and 4 directly from the output of the envelope-tracking power supply 60, might also be utilized.

In accordance with another aspect of the present invention, the adaptation provided by the DSP 50 for both the MSP predistortion and the envelope signal predistortion is to ensure that the desired performance of the transmitter 5 is suitable over a range of the various operational parameters and factors associated with the operation of the power amplifier. Specifically, the adaptation provided by DSP block 50 in the predistortion of the envelope addresses factors such as component aging, power level changes in the input signal 12 and temperature changes in the various components and circuits that are utilized to construct and realize the disclosed transmitter 5, such as the amplifier 10, the power supply 60 or DSP 50. Such adaptation may be provided by the DSP blocks 72, 28, which receive both the input signal and an output feedback signal (path 42, path 84) and/or in the actual predistortion circuits 22, 70. The specific layout and configuration of DSP block 50 is not limiting in the present invention and may be arranged in various different ways to achieve the invention.

One of the significant advantages provided by the present invention is that predistortion of the envelope signal, as discussed herein, does not require a precise following of the envelope waveform to provide greater efficiency in the operation of the RF power amplifier 10. Rather, the present invention ensures that the power requirements of power amplifier 10, and specifically the required voltage at the device drain are met or exceeded by the envelope-tracking power supply 60. This is significantly different from the case of envelope restoration that is required in envelope elimination and restoration (EE&R) techniques, wherein the precise envelope waveform must be used at all times in order to maintain good signal fidelity and spectral performance. This aspect of the invention significantly reduces the complexity of the circuitry required as the predistortion of the envelope performed can generate a signal 74 fed to the power supply 60, which does not precisely follow the input envelope. As such, a suitable margin may be built into the predistorted envelope signal, as discussed above, to provide the desired envelope-tracking process.

Further information regarding basic LUT predistortion and polynomial-based predistortion may be found in U.S. patent application Ser. No. 10/386,047, entitled "Signal Sample Acquisition Techniques" and U.S. patent application Ser. No. 10/386,291, entitled "Amplifier Control System with Statistical Enhancement of Resolution of Digital Control Signals." Both of those applications are incorporated by reference herein in their entireties.

While various illustrations of the invention set forth above utilize digital predistortion of the envelope signal and/or the MSP signal, other predistortion techniques, such as analog predistortion techniques, may also be utilized. For example, various different analog predistortion circuits might be utilized in the MSP predistortion circuit 22.

Figure 7:
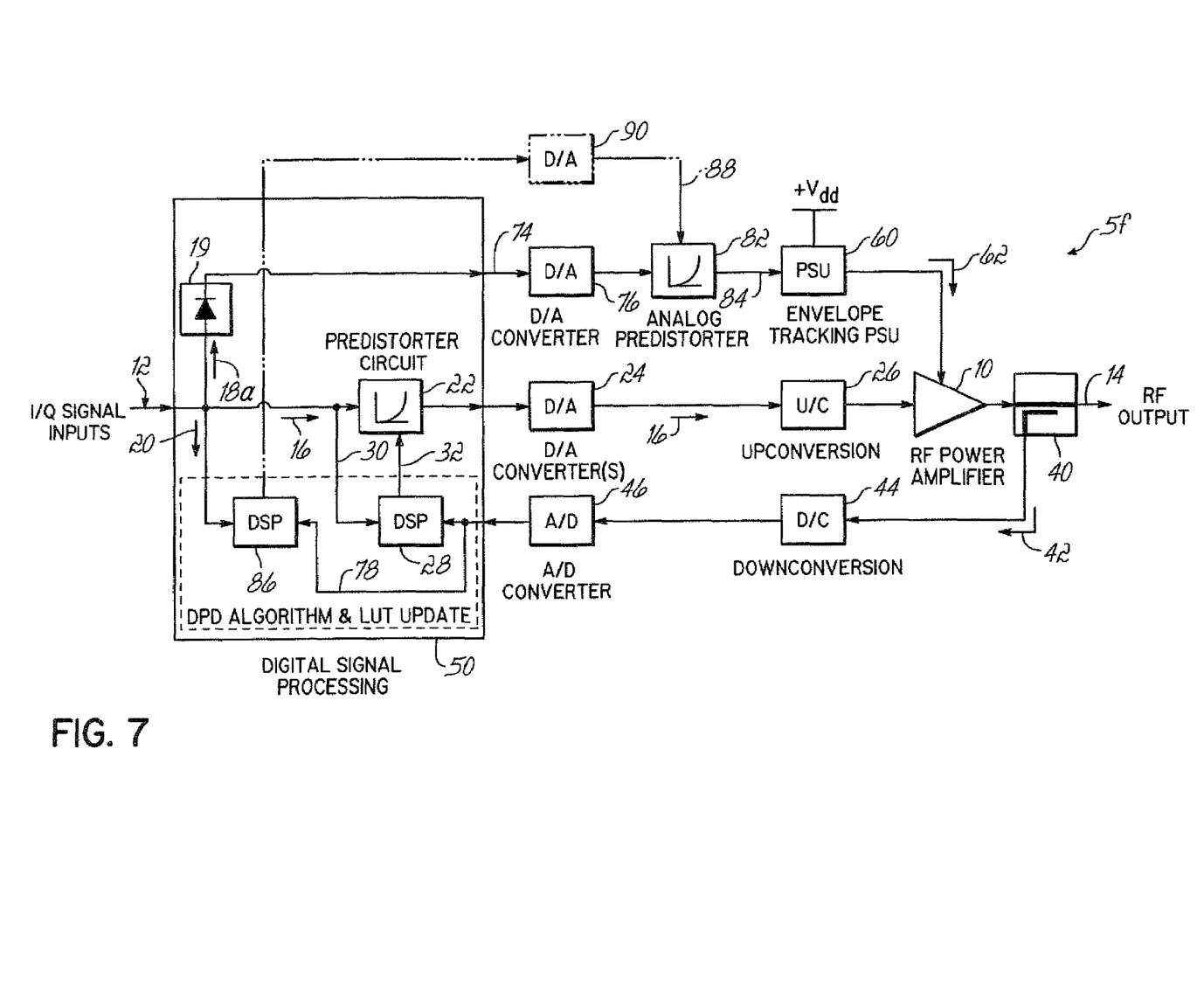
FIG. 7 is an alternative embodiment of the invention utilizing analog predistortion of the input signal envelope.

Such analog distortion of the envelope signal occurs after the digital I/O input signal 12 has been converted to an appropriate analog signal. Referring now to FIG. 7, wherein like reference numerals illustrate like components, as noted above, the envelope path 18a of the DSP circuit 50 provides envelope detection, such as by a suitable envelope detector (not shown). The detected envelope signal 74 of block 50 and path 18a is directed to an appropriate D/A converter 76. The analog signal is then directed to an analog predistortion circuit 82. The output of the predistortion circuit 82 on line 84 is then fed to the appropriate envelope modulation input of the envelope-tracking power supply 60.

The analog predistortion circuit may take various different forms and might be constructed, for example, utilizing analog components such as diodes, transistors, operational amplifiers, and conventional RF or IF amplifiers. For example, predistortion circuit 82 might utilize analog distortion techniques such as cubic predistortion, diode predistortion, transistor predistortion and/or curve-fitting predistortion, to name a few. These and other various different possible analog predistortion techniques for the envelope signal or MSP signal in accordance with the principles of the invention are set forth in P. B. Kenington, *High Linearity RF Amplifier Design*, Norwood, Mass., USA: Artech House, 2000, Chapter 6, authored by the inventor of the present application and incorporated herein by reference in its entirety.

Analog predistortion circuit 82 may operate without external control. However, FIG. 7 illustrates, in dash lines, an alternative embodiment wherein control might be provided for the analog predistortion circuit 82. To that end, a DSP block 86 and control line 88 with suitable D/A circuitry 90 may be utilized to control circuit 82. As noted above, the DSP block 86 might be incorporated into a larger DSP block 50, which provides predistortion and adaptive circuitry for the MSP, as well as digital processing functions associated with control of predistortion circuit 82.

Some examples of analog predistortion, which might be utilized for predistorting the envelope signal according to the invention, are set forth above. Of course, such a list is not exhaustive. A person of ordinary skill in the art will recognize that other predistortion techniques may also be suitable for the present invention in order to provide the desired predistortion of the envelope signal, as discussed above, to ensure that the power requirements of the power amplifier 10 are met by the envelope-tracking power supply 60.

While the present invention has been illustrated by a description of various embodiments and while these embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the spirit or scope of applicant's general inventive concept.

What is claimed:

1. A transmitter comprising:
   an input signal source having an input signal that includes both amplitude and phase information;
   an amplifier coupled to the input signal source and operable for receiving the input signal with amplitude and phase information and amplifying the input signal to produce an output signal;
   a power supply coupled to the amplifier for supplying power to the amplifier, the power supply operable for tracking the power level of an input signal envelope rather than the precise envelope waveform and varying the level of a power supply output signal supplied to the amplifier, according to a transfer function of the power supply, in response to variation of the power level of the input signal envelope rather than the precise envelope waveform;
   a digital predistortion circuit coupled to the power supply, the digital predistortion circuit operable for receiving a digital representation of the input signal envelope and digitally predistorting the input signal envelope tracked by the power supply to address non-linearities in the transfer function of the power supply and to produce a predistorted signal that does not precisely follow the input signal envelope thereby improving the input signal envelope-tracking capabilities of the power supply.

2. The transmitter of claim 1 wherein the digital predistortion circuit is operable for digitally predistorting the input signal envelope for addressing slew rate limitations of the power supply.

3. The transmitter of claim 1 wherein the digital predistortion circuit includes at least one of a Look Up Table circuit or a Polynomial-based circuit.

4. The transmitter of claim 1 wherein the digital predistortion circuit is operable for digitally predistorting the input signal envelope to produce a predistorted signal that causes over compensation in the level of power supplied to the amplifier by the power supply to ensure proper amplification.

5. The transmitter of claim 4 wherein the overcompensation caused by the digital predistortion is related to the level of the input signal envelope.

6. The transmitter of claim 1 wherein the digital predistortion circuit is adaptable for varying the digital predistortion of the input signal envelope to maintain proper amplification based on the variation of operational parameters for circuit components of at least one of the amplifier, power supply or digital predistortion circuit.

7. The transmitter of claim 1 wherein the power supply varies the level of power supplied to the amplifier by varying drain voltage at the amplifier, the digital predistortion circuit being operable for digitally predistorting the input signal envelope to cause the level of power supplied to the amplifier to meet or exceed a required drain voltage.

8. The transmitter of claim 1 wherein the digital predistortion circuit is adaptable, and further comprising digital signal processing circuitry coupled to the digital predistortion circuit for adapting the digital predistortion circuit based on at least one of the input signal and the output signal.

9. The transmitter of claim 1 wherein the digital predistortion circuit is adaptable, and further comprising digital signal processing circuitry coupled to the digital predistortion circuit for adapting the digital predistortion circuit based on at least one of the input signal and a tracking output signal of the power supply.

10. A transmitter comprising:
    an input signal source having an input signal that includes both amplitude and phase information;
    an amplifying circuit coupled to the input signal source for amplifying the input signal to produce an output signal;
    a power supply operable for varying the level of a power supply output signal supplied to the amplifier, according to a transfer function of the power supply, in response to variation of a power level of an input signal envelope that is tracked by the power supply rather than the precise envelope waveform;
    a digital predistortion circuit operable for receiving and digitally predistorting a digital representation of the input signal envelope before it is received by the power supply to address non-linearities in the transfer function of the power supply and to produce a predistorted signal that does not precisely follow the input signal envelope thereby improving the input signal envelope-tracking capabilities of the power supply.

11. The transmitter of claim 10 wherein the digital predistortion circuit is operable for digitally predistorting the input signal envelope for addressing slew rate limitations of the power supply.

12. The transmitter of claim 10 wherein the digital predistortion circuit includes at least one of a Look Up Table circuit or a Polynomial-based circuit.

13. The transmitter of claim 10 wherein the digital predistortion circuit is operable for digitally predistorting the input signal envelope to produce a predistorted signal that causes over compensation in the level of power supplied to the amplifier by the power supply to ensure proper amplification.

14. The transmitter of claim 10 wherein the digital predistortion circuit is adaptable for varying the digital predistortion of the input signal envelope to maintain proper amplification based on the variation of operational parameters for circuit components of at least one of the amplifier, power supply or digital predistortion circuit.

15. The transmitter of claim 10 wherein the digital predistortion circuit is adaptable, and further comprising digital signal processing circuitry coupled to the digital predistortion circuit for adapting the digital predistortion circuit based on at least one of the input signal and the output signal.

16. The transmitter of claim 10 wherein the digital predistortion circuit is adaptable, and further comprising digital signal processing circuitry coupled to the digital predistortion circuit for adapting the digital predistortion circuit based on at least one of the input signal and a tracking output signal of the power supply.

17. A method of amplifying a signal comprising:
amplifying an input signal that includes both amplitude and phase components with an amplifier to produce an output signal;
tracking the power level of an envelope of the input signal envelope rather than the precise envelope waveform with a power supply coupled to the amplifier and varying the level of a power supply output signal supplied to the amplifier by the power supply, according to a transfer function of the power supply, in response to variation of the power level of the input signal envelope rather than the precise envelope waveform;
digitally predistorting the tracked input signal envelope with a digital predistortion circuit prior to the power supply and addressing non-linearities in the transfer function of the power supply to produce a predistorted signal that does not precisely follow the input signal envelope and to improve the input signal tracking capabilities of the power supply.

18. The method of claim 17 wherein the digital predistortion of the tracked input signal envelope addresses slew rate limitations of the power supply.

19. The method of claim 17 further comprising digitally predistorting the input signal envelope to produce a predistorted signal that causes over compensation in the level of power supplied to the amplifier by the power supply to ensure proper amplification.

20. The method of claim 17 further comprising varying the digital predistortion of the input signal envelope to maintain proper amplification based on the variation of operational parameters for circuit components of at least one of the amplifier, power supply or digital predistortion circuit.

21. The method of claim 17 further comprising adapting the digital predistortion of the input signal envelope based on at least one of the input signal and the output signal.

22. The method of claim 17 further comprising adapting the digital predistortion of the input signal envelope based on at least one of the input signal and an output signal of the power supply.

* * * * *